April 26, 1960 S. L. DAWSON 2,934,711

R. F. AMPLIFIER

Filed May 24, 1957

INVENTOR.
SYLVAN L. DAWSON
BY Moody & Habecker
ATTORNEYS

United States Patent Office 2,934,711
Patented Apr. 26, 1960

2,934,711

R.F. AMPLIFIER

Sylvan L. Dawson, Marion, Iowa, assignor to Collins Radio Company, Cedar Rapids, Iowa, a corporation of Iowa Application May 24, 1957, Serial No. 661,542

2 Claims. (Cl. 330—87)

This invention relates to radio frequency amplifiers and more particularly to the first radio frequency amplifier in radio receivers.

Since the beginning of vacuum tube radio frequency amplifier systems, the art has been concerned with numerous problems. In the last twenty years these problems have become acute as a result of greater numbers of transmitting stations of high power in adjacent channels. As communication distances increase and man-made noise and interference increases, the ability of the radio receiver to receive the desired signal and reject all other adjacent channel signals has become increasingly difficult and important.

An early attempt at a radio frequency amplifier having low internal noise and showing sideband rejection is the United States Patent to Winther, 1,700,393, issued January 29, 1929. The patent to Winther, utilizing the then available triode tube in a transformer coupled cathode output circuit, attempted to reduce the receiver noise yet provide satisfactory radio frequency amplification. Later attempts at amplifier arrangements which are low noise originating yet have relatively high gain are typified by the well-known cascode amplifier and by numerous amplifiers disclosed in the "Proceedings of the Institute of Radio Engineers," volume 33, October 1945, pages 707 to 711.

In all of these circuits, however, the goal has never quite been reached of an amplifier which provides low noise origination in the stage itself, good gain, high adjacent channel rejection, and low cross-modulation. The term "cross-modulation" as used here is the modulation of the desired carrier by the modulation present on adjacent channel carriers. "Monkey-chatter" is exemplary of the cross-modulation products arising in the local circuits when they are sensitive to cross-modulation.

In measuring the cross-modulation products, a 100% amplitude modulated carrier spaced 10% of the desired carrier ($f_1$) away from the desired carrier is varied in carrier strength from 1 to 10 volts. The desired carrier may be at any level, such as 20 to 2,000 microvolts, since this level does not affect the cross-modulation. At any particular level, the level of the cross-modulation products below the desired carrier is the measure of the value of the circuit. Under the conditions above, a 3 volt adjacent channel signal so affected the cascode circuit that the undesired signal modulation was only 24 decibels below the amplitude of the desired carrier $f_1$. Under the same conditions, the circuit described herein yields cross-modulation 50 decibels down, below the desired carrier level.

It is an object of the invention to provide a radio frequency amplifier peculiarly adapted to the first amplifier stage of radio receivers in that it has low cross-modulation with a good signal-to-noise factor.

It is an object of this invention to provide a radio receiver input amplifier stage having very low cross-modulation products.

It is a feature of this invention that a grounded plate triode amplifier is utilized with an output coupling circuit of special nature.

It is a feature of this invention that a triode tube is utilized in a circuit having high stability, permitting the full use of the low noise characteristic of the triode.

It is a further feature of the invention that a triode amplifier having grid input and cathode output utilizes a cathode load with a good power match at the desired resonant frequency and high inverse feedback at all other frequencies to provide the low noise characteristic of the triode without neutralization, and to achieve very good cross-modulation insensitivity.

Further objects, features, and advantages of the invention will become apparent from the following description and claims when read in conjunction with the accompanying drawing, in which:

Figure 1:
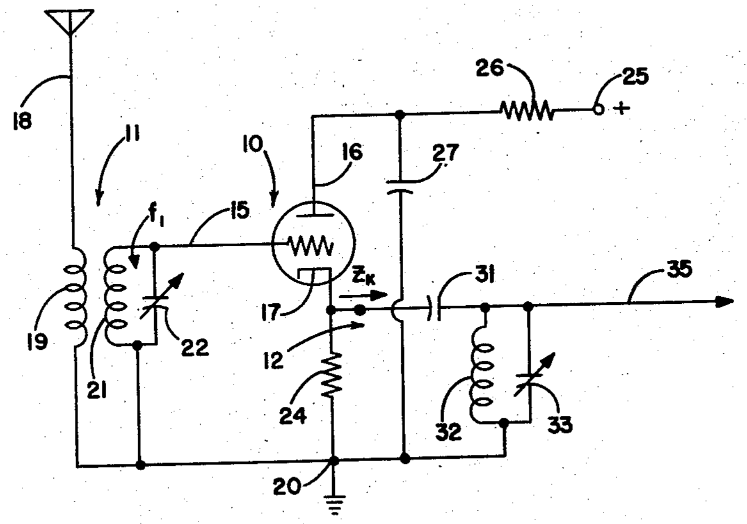
Figure 1 shows a signal-circuit diagram illustrating the invention.

In Figure 1 a grounded plate triode amplifier 10 has a grid input circuit 11 and a cathode load circuit 12. The triode amplifier 10 has an input grid 15, a plate or anode 16, and a cthode 17. Connected to grid 15 is the input circuit 11. A bias circuit for the amplifier is not shown since it is not a part of the invention.

The input circuit 11 connects an antenna 18 to the receiver system. The antenna 18 is connected through a primary coil 19 to the ground 20. This passes the antenna currents through the primary coil 19 of the input circuit 11 in a manner well known in the receiver art. The secondary 21 of the input transformer is coupled magnetically to the input coil 19. This coil is also resonated by a capacitor 22 which tunes the input circuit 11 to a desired frequency $f_1$. One side of the secondary coil 21 is connected to ground 20 and the other side is connected to the grid 15.

The output of the amplifier 10 is the current of cathode 17. A shunting resistor 24 connects cathode 17 to ground to complete the plate current circuit. Across the shunting resistor 24 is the impedance 12, $Z_K$.

The cathode load impedance $Z_K$ is composed of a series capacitor 31 and inductor 32, with inductor 32 paralleled by capacitor 33. The $Z_K$ elements are chosen to be series resonant at the desired frequency $f_1$ while the parallel circuit of inductor 32 and capacitor 33 exhibits an anti-resonance at the desired frequency $f_1$ and a relatively high impedance is experienced across this paralleled circuit. The output of the load circuit 12 is taken from across the paralleled inductance-capacitor combination. The frequency characteristic of this circuit is important to the operation of the amplifier in elimination of cross-modulation and adjacent channel interference.

Looking in at the terminal, seeing $Z_K$, the impedance is relatively high at frequencies away from the desired carrier frequency $f_1$. As the circuit approaches the desired frequency $f_1$, the impedance stays relatively high but then dips rather sharply at the desired frequency since capacitor 31 and the combination of inductance 32 and adjustable capacitor 33 in parallel are series resonant at the desired frequency $f_1$ to provide a relatively low impedance load for the cathode circuit.

The load circuit 12 may possibly assume other configurations but must have this particular frequency characteristic. The off-frequency impedance is very high relative to the characteristic output impedance of the cathode circuit, while the on-frequency impedance is matched to the cathode output impedance. A graph of this characteristic is shown in Figure 2.

Figure 2:
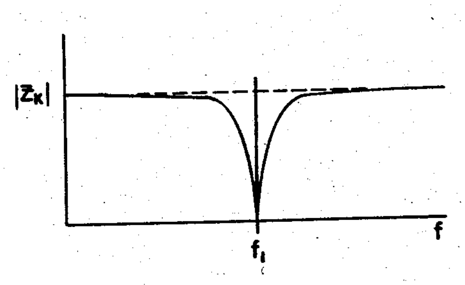
Figure 2 shows a characteristic curve of the cathode impedance as a function of frequency.

In Figure 2 the magnitude of the load impedance 12 is graphed as a function of frequency. As can readily be seen, the impedance drops sharply adjacent the desired frequency $f_1$ to provide a narrow slot where the impedance is approximately equal to that of the cathode follower output. At all other frequencies the impedance is as high as possible, consistent with available circuit techniques.

The plate circuit is grounded for signals. Plate or anode 16 is connected to a source of anode potential at terminal 25 through a dropping resistor 26. Capacitor 27 is connected directly between plate 16 and ground 20 to bypass all radio frequencies appearing at the plate. Resistor 26 and condenser 27 are calculated to provide decoupling between the plate and the supply voltage terminal 25. This decoupling is designed to be most effective in the several decades around the desired frequency $f_1$.

In operation, the amplifier operates as follows: The input circuit 11 applies a relatively narrow band of radio frequencies to the input or grid 15 of amplifier 10. Input circuit 11 is adjusted to give as good a signal transfer from antenna 18 to grid 15 as possible, consistent with the impedance levels available. Cathode resistor 24 may be tapped to provide the desired operating bias of the tube by parallel feed in a manner well known in the art. The over-all value of the cathode resistor 24 is set to provide a high impedance level in the cathode circuit off-frequency. Resistors 24 and 26 are adjusted to provide the desired transconductance and plate current of the tube for minimizing tube noise and optimizing tube gain. It is to be noted that no neutralization of the triode is necessary for this circuit, the circuit permitting full utilization of the superiorly low noise factor of this type of tube.

In view of the bypass capacitor 27, all plate current variations are translated into voltage variations across resistor 24. The effect of the load circuit 12 is to provide a transfer of energy from the cathode to the output circuit 35 in a manner in accord with the power matching between the cathode of the amplifier tube and the output circuit. Thus, the high off-frequency impedance of the load circuit means that the power transfer is very low and that the inverse feedback of the cathode follower is very high. Strong signals which are applied to grid 15 through input coupling circuit 11 despite its selectivity, are subjected to extremely high inverse feedback, reducing their amplitude at the cathode and, as a result of the extremely unfavorable power match, are further attenuated between the cathode and the output circuit 35. This results in reduction of the undesired channel's modulation, preventing cross-modulation onto the desired carrier. Signals which are tuned to $f_1$ are translated from antenna 18 to grid 15 most favorably and, in view of the very low impedance of the output circuit, are subjected to very little inverse feedback in the cathode circuit. This increases the power gain of the tube. The effective matching of the load impedance of the cathode also favors optimum power transfer to the output circuit 35.

A typical triode amplifier embodying the invention comprises a type 5687 dual triode tube with both sections paralleled for amplifier 10, having a plate current of 30 milliamperes per plate and a transconductance of 10,000 micromhos per section. The input circuits are tunable over a range of 3.7 to 7.7 megacycles. The cathode resistor 24 has about 500 ohms resistance. Of the reactances, the series capacitor 31 is 36 micromicrofarads, the shunt inductor 32 ranges from .9 to 3.8 microhenries, and the shunt capacitor 33 is 430 micromicrofarads. The noise factor of this amplifier is 3.5 decibels, the gain is 16.5 decibels and the cross-modulation from an adjacent carrier 10% of the desired carrier away, 100% modulated and at a 3 volt level was 50 decibels below the desired carrier. This amplifier thus represents a considerable advance in the receiver art, greatly reducing the effects of nearby signals.

Although this invention has been described with respect to particular embodiments thereof, it is not to be so limited because changes and modifications may be made therein which are within the full intended scope of the invention as defined by the appended claims.

I claim:

1. A low-noise low cross-modulation amplifier for a desired frequency comprising an input circuit, an electronic amplifier having input and output electrodes, said input circuit being connected to the input electrode of said amplifier, a first high impedance load means having one terminal thereof connected to said output electrode and serially connected through said input circuit to said input electrode, a load control circuit shunting said first high impedance load means, said load control circuit comprising a capacitor and an inductor in series therewith with said inductor being shunted by a second capacitor, the output of said amplifier being across said inductor, said load control circuit exhibiting a series resonance with corresponding low impedance at said desired frequency, said inductor and second capacitor exhibiting an anti-resonant effect at said desired frequency, said load control circuit providing a low impedance shunt across said first load means for input frequencies corresponding to said desired frequency and thereby reducing inverse feedback between said input and output electrodes for said desired frequency.

2. An electronic amplifier comprising a vacuum tube having a plate, a grid, and a cathode, an input circuit connected between said grid and ground, said input circuit being tuned to a desired frequency, desired frequency bypassing means connected between said plate and ground, first impedance means connected between said cathode and ground, said first impedance means having a high impedance level sufficient to introduce degeneration between said cathode and said grid, output impedance means connected to said cathode and comprising a first capacitor and an inductor respectively serially connected between said cathode and ground, a second capacitor paralleling said inductor, the junction between said first and second capacitors connected to an output terminal, said output impedance means exhibiting series resonance with corresponding low impedance at said desired frequency, said inductance and second capacitance exhibiting an antiresonant effect at said desired frequency, whereby a power gain between said input circuit and said output terminal is selectively realized for said desired frequency while frequencies other than said desired frequency are substantially blocked due to degeneration between said cathode and said grid.

References Cited in the file of this patent

UNITED STATES PATENTS

| | | |
|---|---|---|
| 2,510,868 | Day | June 6, 1950 |
| 2,549,761 | Adams | Apr. 24, 1951 |
| 2,630,558 | Arsem et al. | Mar. 3, 1953 |
| 2,637,779 | Craiglow | May 5, 1953 |
| 2,676,214 | Van Weel | Apr. 20, 1954 |
| 2,700,698 | Hammond | Jan. 25, 1955 |
| 2,756,283 | Bach | July 24, 1956 |